United States Patent [19]

Bednorz et al.

[11] Patent Number: 5,278,136
[45] Date of Patent: Jan. 11, 1994

[54] METHOD FOR MAKING A SUPERCONDUCTING FIELD-EFFECT TRANSISTOR WITH INVERTED MISFET STRUCTURE

[75] Inventors: Johannes G. Bednorz, Wolfhausen; Jochen D. Mannhart, Au/Zh; Carl A. Mueller, Hedingen, all of Switzerland

[73] Assignee: International Business Machines Corporation, Armonk, N.Y.

[21] Appl. No.: 731,821

[22] Filed: Jul. 16, 1991

[30] Foreign Application Priority Data

Jan. 7, 1991 [EP] European Pat. Off. ........ 91810006.6

[51] Int. Cl.$^5$ ............................................ H01L 21/336
[52] U.S. Cl. .......................................... 505/1; 505/701; 505/706; 437/40; 437/42
[58] Field of Search .................. 505/1, 701, 703, 706, 505/730, 731; 437/40, 42

[56] References Cited

U.S. PATENT DOCUMENTS

| | | | |
|---|---|---|---|
| 4,980,339 | 12/1990 | Setsune et al. | 505/703 |
| 5,075,283 | 12/1991 | De | 505/701 |
| 5,084,438 | 1/1992 | Matsubara et al. | 505/703 |
| 5,126,315 | 6/1992 | Nishino et al. | 505/703 |
| 5,128,316 | 7/1992 | Agostinelli et al. | 505/701 |
| 5,130,294 | 7/1992 | Char | 505/701 |
| 5,132,282 | 7/1992 | Newman et al. | 505/701 |
| 5,173,474 | 12/1992 | Connell et al. | 505/730 |

FOREIGN PATENT DOCUMENTS

| | | |
|---|---|---|
| 0257474 | 3/1988 | European Pat. Off. . |
| 0293836 | 12/1988 | European Pat. Off. . |
| 0299870 | 1/1989 | European Pat. Off. . |
| 0301646 | 2/1989 | European Pat. Off. . |
| 0324044 | 7/1989 | European Pat. Off. . |
| 0324220 | 7/1989 | European Pat. Off. . |
| 0329103 | 8/1989 | European Pat. Off. . |
| 0341788 | 11/1989 | European Pat. Off. . |
| 0343649 | 11/1989 | European Pat. Off. . |
| 0354804 | 2/1990 | European Pat. Off. . |
| 0371462 | 6/1990 | European Pat. Off. . |
| 3239990 | 10/1988 | Japan . |
| 3308977 | 12/1988 | Japan . |
| 2-42787 | 2/1990 | Japan ................................. 505/701 |
| 2-181482 | 7/1990 | Japan ................................. 505/701 |

*Primary Examiner*—Mary Wilczewski
*Attorney, Agent, or Firm*—Charles W. Peterson, Jr.

[57] ABSTRACT

This field-effect transistor comprises a conductive substrate (2) serving as the gate electrode, an insulating barrier layer (3), and a superconducting channel layer (1) on top of the barrier layer (3). The superconductor layer (1) carries a pair of mutually spaced electrodes (4, 5) forming source and drain, respectively. The substrate is provided with an appropriate gate contact (6).

The substrate (2) consists of a material belonging to the same crystallographic family as the barrier layer (3). In a preferred embodiment, the substrate (2) is niobium-doped strontium titanate, the barrier layer (3) is undoped strontium titanate, and the superconductor (1) is a thin film of a material having a lattice constant at least approximately similar to the one of the materials of the substrate (2) and barrier (3) layers. A preferred material of this type is $YBa_2Cu_3O_{7-\delta}$, where $0 ¢\delta \leq 0.5$.

While the preferred embodiment of the present invention has been herein described, numerous modifications, changes and improvements will occur to those skilled in the art without departing from the spirit and scope of the present invention.

5 Claims, 1 Drawing Sheet

METHOD FOR MAKING A SUPERCONDUCTING FIELD-EFFECT TRANSISTOR WITH INVERTED MISFET STRUCTURE

DESCRIPTION

This invention relates to field-effect transistors having a current channel consisting of high-$T_c$ superconducting material the conductivity of which can be reproducibly influenced by an electrical field, and whose structure is that of an inverted (Metal-Insulator-Superconductor) MISFET in the sense that the substrate is used as the gate electrode. The invention further relates to a method for making superconducting field-effect transistors with inverted MISFET structure.

BACKGROUND OF THE INVENTION

For several decades, the electronics industry has made enormous efforts to shrink the size of electronic components and circuits with the aim of increasing the speed of operation and of reducing the power consumption/dissipation. These efforts have led to the development of integrated circuits and multi-layer ceramic devices which, in a volume of a few cubic millimeters, contain many thousands of transistors and other circuit components. These devices have very high operating speeds owing to the shortened distances the electrons need to travel inside of them. All of the modern circuits use advanced semiconductor materials, such as silicon and gallium arsenide, for example.

The discovery by Bednorz and Mueller (Z. Phys., B64 (1986) p. 189) of a new class of superconductor materials has of course opened another avenue to even lower power consumption and caused a worldwide search for possible applications of these materials in electronic circuitry. A number of studies on the electric field-effect in copper oxide compounds have been reported (for example by U. Kabasawa et al. in Japanese Journ. of Appl. Phys. 29 L86, 1990), but so far only minor field-effects in high-$T_c$ superconductors have been found. However, EP-A-0 324 044 already describes a three-terminal field-effect device with a superconducting channel in which electric fields are used to control the transport properties of channel layers consisting of high-$T_c$ superconductor materials. While this seemed to be a promising approach, growth studies of such devices have shown that in the suggested configuration the ultrathin superconducting layers readily degrade during deposition of insulator layer and top electrode.

In accordance with the present invention, this drawback is avoided through deposition of the superconducting film after the insulating layer, and locating the gate electrode underneath the insulator and the high-$T_c$ film. Still in accordance with the present invention, a conducting substrate is used as the gate electrode, and to facilitate the growth of preferably perfect crystals, substrate and insulator are chosen from the same crystallographic family of materials, that is, the lattice constants of the materials chosen to at least approximately match. For example, electrically conducting Nb-doped $SrTiO_3$ is used for the substrate, and undoped $SrTiO_3$ is used for the insulator layer.

The use of niobium-doped strontium titanate Nb:$SrTiO_3$ in a high-$T_c$ superconductor structure was described by H. Hasegawa et al. in their paper "Contact between High-$T_c$ Superconductor and Semiconducting Niobium-Doped $SrTiO_3$", Japanese Journ. of Appl. Phys., Vol. 28, No. 12, December 1988, pp. L 2210–L 2212, and in their EP-A-0 371 462. These references describe a diode structure where a superconducting film is deposited onto an Nb-doped $SrTiO_3$ substrate. The authors of these references are only interested in measuring the rectifying properties and the resistance in forward and reverse directions. They "demonstrated that there are unknown interfacial layers between the two materials", a problem that the present invention elegantly overcomes.

This invention is based on experimental evidence for a significant electric field-effect recently discovered to exist in thin superconducting films. These experiments were performed with materials of the copper oxide class of superconductors, in particular $YBa_2Cu_3O_{7-\delta}$. Thin films of superconducting $YBa_2Cu_3O_{7-\delta}$ are already known from EP-A-0 293 836. Epitaxial growth of $YBa_2Cu_3O_{7-\delta}$ is described in EP-A-0 329 103. For the purposes of the present invention, the value of "$\delta$" shall be considered to be close to zero (preferred), but it can be as large as 0.5. Those skilled in the art of high-$T_c$ superconductor materials will appreciate that many other materials in that class will be equally suited for the field-effect transistor structures of the MISFET type, as herein suggested. Also, other methods for depositing films of high-$T_c$ materials and of $SrTiO_3$ are known in the art, such as laser evaporation, electron beam evaporation and molecular beam epitaxy.

While the acronym "MISFET" is usually employed to characterize Metal-Insulator-Semiconductor Field-Effect Transistor structures, this term will in the following description be maintained for describing an analogous structure, although the embodiments of the present invention to be described will use different materials, viz. electrically conducting Nb-doped $SrTiO_3$ in place of the Metal, and a superconductor instead of the Semiconductor.

MISFET-type structures have been developed in accordance with the present invention which allow the application of electric fields larger than $10^7$ V/cm across insulating $SrTiO_3$ barriers on ultrathin epitaxially grown $YBa_2Cu_3O_{7-\delta}$ channel layers. Epitaxial growth of $YBa_2Cu_3O_{7-\delta}$ rf-magnetron sputtering is described in EP-A-0 343 649. In these structures, the normal-state resistivity and the density of free carriers in the $YBa_2Cu_3O_{7-\delta}$ films can be modified substantially with gate voltages of on the order of 50 V.

Shortly after the discovery of the high-$T_c$ superconductor materials, Bednorz et al. in their above-cited EP-A-0 324 044 predicted on theoretical grounds that high-$T_c$ superconductor materials may bear an electric field-effect which is much larger than that in low-$T_c$ superconductor materials: The length scale by which electrostatic fields are screened in conducting materials is given by the sum $L_D+L_{DZ}$ of the Debye length $L_D=(\epsilon_0\epsilon_r kT/q^2n)^{\frac{1}{2}}$ and the width of eventual depletion zones $L_{DZ}=N/n$. Here, $\gamma_o$ and $\epsilon_r$ are the dielectric constants of the vacuum and of the conducting material, respectively, k is the Boltzmann constant, T is the absolute temperature, q is the elementary charge, n is the density of mobile carriers, and N the induced areal carrier density. Because of their high carrier density, low-$T_c$ superconductors usually screen electric fields so well that the fields only have a minor influence on materials properties. To attenuate the screening, recent experiments on the electric field-effect in low-$T_c$ superconductors have focused on compounds with exceptionally low carrier density, like doped $SrTiO_3$, with niobium as the dopant, for example.

In high-$T_c$ superconductor compounds, larger field-effects are expected owing to their intrinsically low carrier concentration and because of their small coherence length. The low carrier concentration of about $3...5 \times 10^{21}/cm^3$ leads to screening lengths in the range of tenths of nanometers, and the small coherence lengths allow the fabrication of ultrathin layers with respectable critical temperatures. Superconducting films as thin as $1...2$ nm have already been grown; electric fields can penetrate such films to a considerable extent.

OBJECTS OF THE INVENTION

It is an object of the present invention to minimize degradation effects in superconducting field-effect transistors with an inverted MISFET structure.

It is a further object of the invention to provide superconducting field-effect transistors whose inverted MISFET structure permits the deposition of the superconducting channel layer after the deposition of the insulating barrier layer.

It is still another object of the invention to provide materials for the substrate and insulator layer which have at least approximately the same lattice constants so as to facilitate crystal perfection.

BRIEF DESCRIPTION OF THE DRAWINGS

Details of two embodiments of the transistor and of the inventive method will hereafter be explained by way of example, with reference to the attached drawings in which.

TECHNICAL DESCRIPTION OF THE PREFERRED EMBODIMENT

Figure 1:
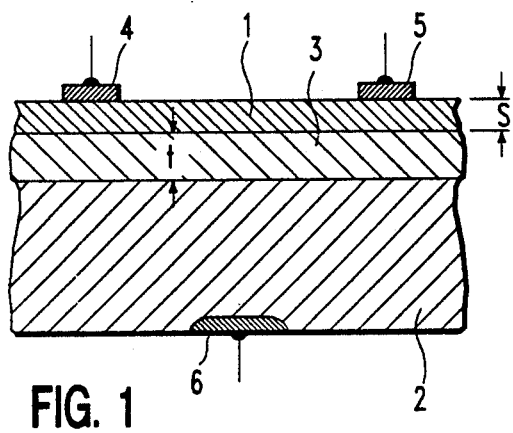
FIG. 1 is a schematic diagram of a first embodiment of a field-effect transistor in accordance with the invention.

To apply large electric fields on thin films of superconducting $YBa_2Cu_3O_7$, in accordance with the invention, an inverted MISFET-structure as shown in FIG. 1 is used. In this structure, a superconducting film 1 of the thickness s is separated from a gate electrode 2 by an insulating layer 3 of the thickness t. Besides the thickness of the superconductor, the resistivity $rho_1$ and the breakthrough field strength $E_{BD}$ of the insulator are crucial parameters. The required values for $E_{BD}$ and for $rho_1$ can be simply estimated, if space charge effects are neglected: To induce a surface charge density in superconducting film 1 which corresponds to the unperturbed density n of mobile charge carriers, the capacitor consisting of gate electrode 2 and superconductor film 1 has to be biased with a voltage $$V_G = \frac{gnst}{\epsilon_o \epsilon_i} \qquad (1)$$

where $\epsilon_i$ is the dielectric constant of the insulator 3. Equation (1) implies that to modulate the carrier density in high-$T_C$ superconductors substantially, the product $\epsilon_i \times E_{BD}$ of the dielectric constant $\epsilon_i$ and the breakdown field strength $E_{BD}$ has to be of the order of $10^8$ V/cm. (For comparison, $SiO_2$ has an $\epsilon_i \times E_{BD}$ product of $4 \times 10^7$ V/cm at room temperature).

In addition, the normal-state resistivity of the insulator has to be sufficiently high to avoid leakage currents which result in an input loss $V_G \times I_G$. For a typical case of $I_G < I_{DS}/100$ and $I_{DS} = 10$ μA, and an area of the gate electrode 2 of 1 $mm^2$, the resistivity must be higher than $10^{14} \Omega cm/\epsilon_i$ at operating temperature.

In view of these requirements, insulating layers with high dielectric constants are recommended. Therefore, and for its good compatibility with the growth of $YBa_2Cu_3O_7$, $SrTiO_3$ is selected as barrier material for insulating layer 3. The compatibility of $YBa_2Cu_3O_7$ with $SrTiO_3$ has already been pointed out in EP-A-0 299 870 and EP-A-0 301 646, and the use of a buffer layer of oriented polycrystalline $SrTiO_3$ has been described in EP-A-0 324 220 and EP-A-0 341 788. The method recommended for fabricating the MISFET structure of FIG. 1 with a $SrTiO_3$ barrier layer 3 involves the following steps:

1. A gate electrode 2 is provided in the form of a (conductive) n-type {100}-oriented Nb-doped $SrTiO_3$ single crystal grown by a conventional zone melting technique. The doping factor is between $10^{-3}$ and 5% niobium, preferably at 0.05% Nb. This gate electrode 2 is used as the substrate for all further depositions.

It should be pointed out that, while a single-crystal substrate is preferred, a polycrystalline or amorphous substrate may be used as well. Also, dopants other than niobium may be used to render the $SrTiO_3$ conducting. One example is an oxygen deficit.

2. On top of the substrate 2, a {100}-oriented insulating layer 3 of $SrTiO_3$ is epitaxially grown by reactive rf-magnetron sputtering at 6,7 Pa in an O sub 2/Ar atmosphere at 650° C. (temperature of the sample holder). The thickness of this layer can be in the range of 1 to 1000 nm.

3. Without breaking vacuum, a superconducting film 1 of $YBa_2Cu_3O_{7-\delta}$ is epitaxially grown on top of the insulating $SrTiO_3$ layer 3 by hollow cathode magnetron sputtering, wherein the value of "$\delta$" is preferably equal to zero, but can be as large as 0.5. The thickness of the superconductor layer can be in the range of 1 to 1000 nm.

4. Metal pads, for example gold pads 4 and 5, are then sputtered onto the $YBa_2Cu_3O_{7-\delta}$ top layer 1 to form source and drain contacts, respectively.

5. Finally, a gate contact 6 is provided by diffusing silver into the Nb-doped $SrTiO_3$ gate/substrate 2.

Figure 2:
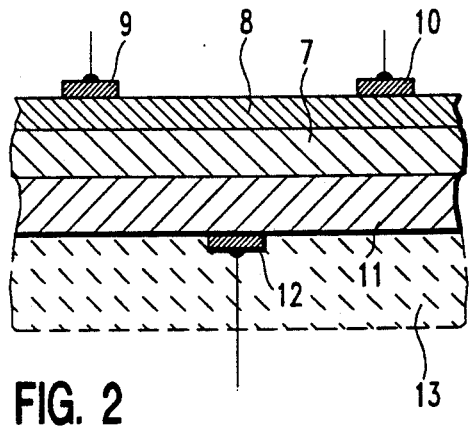
FIG. 2 is a schematic diagram of a second embodiment of an inventive field-effect transistor.

FIG. 2 shows a slightly different (but more truly MISFET) structure. The preferred way to manufacture this structure involves the following steps:

1. A {100}-oriented $SrTiO_3$ layer 7 is provided as an insulator which is polished down to a thickness of 20...30 μm.

2. On top of the thinned insulator 7, a $YBa_2Cu_3O_{7-\delta}$ film 8 is sputtered, wherein the value of "$\delta$" is preferably equal to zero, but can be up to 0.5.

3. Gold pads 9 and 10 are provided on top of the superconductor layer 8 to form source and drain contacts, respectively.

4. On the back side of the thinned insulator, a conducting gate electrode 11 in the form of a metal layer, a gold layer, for example, is deposited. It bears an appropriate contact 12.

5. Optionally, gate electrode 11 may be supported on an insulating substrate 13, be it for stability, as indicated in FIG. 2.

Figure 3:
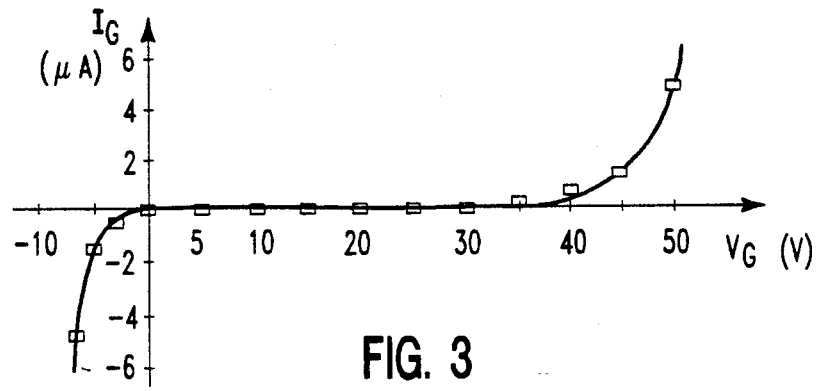
FIG. 3 shows the $I_G/V_G$ characteristics of the field-effect transistor of FIG. 1.

FIG. 3 shows a typical characteristic of the gate current $I_G$ through the insulating layer 3 as a function of the applied gate voltage $V_G$ for a device in accordance with FIG. 1.

The measured characteristic is the one expected for a pin-junction, the superconductor and the substrate being the p and n electrodes, respectively. In one sample studied, the insulating barrier had a resistivity of $4 \times 10^{13}$ Ωcm at a forward bias of 3 V, and of $4 \times 10^{14}$ Ωcm at a reverse bias of 20 V. Breakdown field strengths at room temperature of $5 \times 10^5$ V/cm and of $1.5 \times 10^7$ V/cm were obtained in the forward and reverse directions, respectively. The capacitance of this sample was $2 \times 10^{-7}$ F/cm² at room temperature. This value corresponds to a relatively low $\epsilon_i = 8$ (t=40 nm). This low dielectric constant may be caused by an insulating surface layer on the Nb- doped SrTiO$_3$ substrate, which was observed in agreement with a report by Hasegawa et al. in Japan. Journ. of Appl. Phys., 28 L2210 (1989). The layer has a breakdown voltage of about 2 V. Nevertheless, the $\epsilon_i E_{BD}$ products of the SrTiO$_3$ barrier layers under reverse bias were about $10^8$ V/cm, which is the limit of the values required by Eq. (1).

Figure 4:
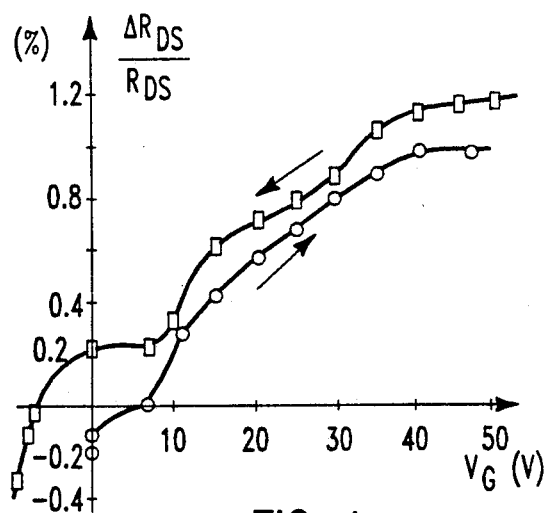
FIG. 4 is a diagram showing the dependence of the changes of the channel resistivity as a function of the gate voltage $V_G$.

The influence of the gate voltage $V_G$ on the channel resistance $R_{DS}$ of a sample that consists of 10 nm thick YBa$_2$Cu$_3$O$_{7-\delta}$ film on a 40 nm thick SrTiO$_3$ barrier layer is shown in FIG. 4. Obvious from the diagram is an approximately linear dependence of the measured normal-state resistivity on the gate voltage, and that the effect on resisitivity changes sign when the gate voltage is reversed. The measured polarity of the voltage induced resistance change agrees with the theoretical expection: YBa$_2$Cu$_3$O$_{7-\delta}$ is a p-type conductor, hence a positive voltage $V_G$ at the gate electrode depletes the free carrier concentration in the channel and, therefore, increases the channel resistance $R_{DS}$, whereas a negative voltage $V_G$ at the gate electrode enhances the free carrier concentration in the channel and, therefore, decreases the channel resistance $R_{DS}$.

The value of the measured channel resistance $R_{DS}(V_G)$ agrees well with the theoretical prediction: Applying 30 V to the sample that was used to generate FIG. 4 and which has a capacitance of $2 \times 10^{-7}$ F/cm², induces a change in the electron density on the electrodes of $2 \times 10^{13}$/cm². On the other hand, YBa$_2$Cu$_3$O$_{7-\delta}$ has a carrier density of about 3–$5 \times 10^{21}$/cm³, and this corresponds to an areal density of mobile holes in the 10 nm thick channel layer of 3–$5 \times 10^{15}$/cm². This means that, within experimental error, at any temperature a change of the free carrier density in the channel results in a corresponding change in $R_{DS}$.

Figure 5:
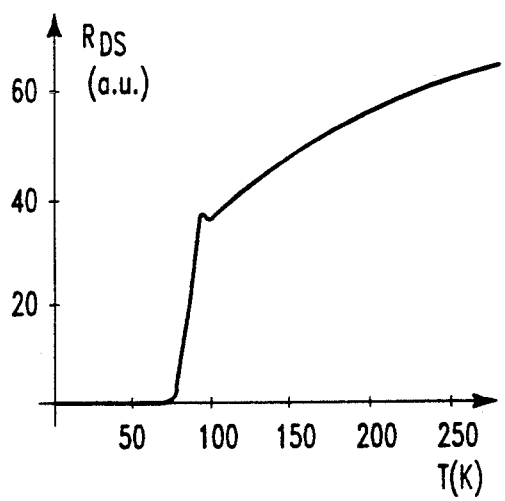
FIG. 5 shows the dependence of the channel resistivity as a function of the absolute temperature.

The temperature dependence of the resistivity $R_{DS}(T)$ of the YBa$_2$Cu$_3$O$_{7-\delta}$ is shown in FIG. 5. The sample is typical for all devices of the type shown in FIG. 1.

The temperature dependence of the voltage-induced variation of the channel resistance change Delta $R_{DS}/R_{DS}$ ($V_G T$) for this sample is depicted in FIG. 4. As shown by this figure, within experimental scatter, the fractional change of the channel resistance Delta $R_{DS}/R_{DS}$ is almost constant as a function of temperature. A temperature-independent Delta $R_{DS}/R_{DS}$ ($V_G T$) ratio is observed down to $T_C$ ($R_{DS}=0$). The change of the channel resistance induced by the gate voltage $V_G$ corresponds to a change of the $R_{DS}(T)$ characteristic at midpoint $T_C$ of 50 mK for $V_G = 18$ V.

From the measurements taken with several sample embodiments of the field-effect transistor in accordance with the invention, it has been determined that the operating gate voltage $V_G$ should be in the range between 0.1 and 50 V, the thickness s of the superconducting film should be in the range between 1 and 30 nm, and the thickness of the insulating layer should be in the range between 0.3 and 100 nm.

To make sure that the structures prepared in accordance with the present invention indeed perform as expected, i.e. that the current flow in the channel can actually be controlled by the electrical field-effect, spot-checking measurements have been made as follows:

1. Measurement of $R_{DS}(V_G)$ on samples that had barrier layer resistances which were lower by a factor of 500 (at 20 V) than the sample yielding the curves in FIG. 4. This measurement showed the same $R_{DS}(V_G)$ characteristics, demonstrating that the observed effect is not caused by the finite gate current $I_G$.

2. To elucidate whether $V_G$ primarily affects the channel resistance $R_{DS}$ or whether the effect is based on a change of $V_{DS}$, $R_{DS}$ was measured for different channel currents $I_{DS}$. Even if $I_{DS}$ is varied by four orders of magnitude, an applied gate voltage results in a change of the channel resistance $R_{DS}R$ and does not induce significant voltages in the channel layer.

MISFET-type heterostructures consisting of YBa$_2$Cu$_3$O$_{7-\delta}$/SrTiO$_3$ multilayers have been developed which allow the application of electric fields larger than $10^7$ V/cm to superconducting films of YBa$_2$Cu$_3$O$_{7-\delta}$. In these devices, electric field-effects generate changes in the channel resistance. The YBa$_2$Cu$_3$O$_{7-\delta}$ films have a preferred thickness on the order of 10 nm and are operated with gate voltages of about 30 Volts. The channel resistivity changes can be attributed to equally strong changes of the carrier density in the high-$T_c$ superconductor.

We claim:

1. A method for making a field-effect transistor having an electrical field-controlled current channel and gate, source and drain electrodes comprising the steps of:
   a) providing a gate electrode (2) of a conductive n-type {100} oriented Nb-doped SrTiO$_3$ single crystal that has a doping factor between 0.001% and 10% niobium, said gate electrode serving as a substrate;
   b) depositing on top of said gate electrode (2) a {100}-oriented insulating layer (3) of SrTiO$_3$;
   c) depositing on top of said insulating SrTiO$_3$ layer (3), a superconducting thin film (1) of YBa$_2$Cu$_3$O$_{7-\delta}$, wherein $0 \leq \delta \leq 0.5$;
   d) depositing onto said YBa$_2$Cu$_3$O$_{7-\delta}$ layer (1) gold pads (4,5) to form source and drain contacts, respectively; and
   e) depositing a gate contact (6) on the Nb-doped SrTiO$_3$ gate/substrate (2).

2. A method as in claim 1, wherein said layer (3) of SrTiO$_3$ is epitaxially grown by reactive rf-magnetron sputtering at 6.7 Pa in an O$_2$/Ar atmosphere at 400° to 900° C.

3. A method as in claim 1, wherein said superconducting film (1) of YBa$_2$Cu$_3$O$_{7-\delta}$ is epitaxially grown on top of the insulating SrTiO$_3$ layer (3).

4. A method as in claim 1, wherein said gate contact (6) is provided by diffusing silver into the Nb-doped SrTiO$_3$ gate/substrate (2).

5. The method as in claim 1 wherein said doping factor is 0.05% Nb.

* * * * *